United States Patent [19]
Nguyen et al.

[11] Patent Number: 5,925,189
[45] Date of Patent: Jul. 20, 1999

[54] LIQUID PHOSPHOROUS PRECURSOR DELIVERY APPARATUS

[75] Inventors: Chau Nguyen, San Jose; Visweswaren Sivaramakrishnan, Cupertino, both of Calif.

[73] Assignee: Applied Materials, Inc., Santa Clara, Calif.

[21] Appl. No.: 08/568,193

[22] Filed: Dec. 6, 1995

[51] Int. Cl.$^6$ .................................................. C23C 16/00
[52] U.S. Cl. .......................................... 118/726; 118/715
[58] Field of Search .................................... 118/715, 726

[56] References Cited

U.S. PATENT DOCUMENTS

| | | | |
|---|---|---|---|
| 5,234,724 | 8/1993 | Schmidt | 427/530 |
| 5,607,002 | 3/1997 | Siegele | 141/198 |

FOREIGN PATENT DOCUMENTS 602595   6/1994   European Pat. Off. .

OTHER PUBLICATIONS

Lankford, The Making Shaping & Treating of Steel, 10th Ed U S Steel Corp, 1985.

*Primary Examiner*—Richard Bueker
*Attorney, Agent, or Firm*—Townsend & Townsend & Crew

[57] ABSTRACT

The present invention recognizes that the build-up of residue in a metal alloy injection valve used to inject a liquid phosphorous precursor compound is due to the nickel in the alloy affecting the liquid phosphorous precursor compound. The invention thus provides components manufactured of an alloy having a low nickel content, preferably less than 5% nickel, and more preferably less than 1%. In an additional aspect of the invention, the alloy is provided with a higher chromium content, preferably at least 15% chromium, more preferably 16–27%.

15 Claims, 2 Drawing Sheets

LIQUID PHOSPHOROUS PRECURSOR
DELIVERY APPARATUS

BACKGROUND OF THE INVENTION

The present invention relates to delivery systems for liquid phosphorous precursors, and in particular to stainless steel containers, piping and injection valves for injecting liquid triethylphosphate (TEPO), TMP or TEP into a chemical vapor deposition (CVD) chamber.

A variety of different systems can be used to deliver processing gases to a chemical vapor reaction chamber. In a boiler system, the liquid is heated into vapor form. In a "bubbler" system, gaseous helium is introduced into a liquid in a container, resulting in some of the liquid being bubbled out of solution. When the liquid contains a phosphorous precursor, such as TEPO, TMP or TEP, and the container or piping is stainless steel, residue build-up has been observed, in particular where the stainless steel is exposed to heat.

Injection valves are often used for providing a processing gas to a CVD chamber. In one method of doing this, the active gas component is provided in liquid form to an injection valve. The injection valve provides the liquid through an orifice past which a carrier gas is provided. A pressure drop is created which causes the liquid to vaporize into gaseous form. Typically, a heater is also provided on the valve to prevent condensation of the processing gas. A typical inert carrier gas is helium.

One problem encountered with such valves is the build-up of residue around the orifice, which can prevent proper seating of a cut-off plug to hinder control of the valve. Excessive build-up of residue can also block the orifice itself, or severely restrict the flow of liquid through the orifice. Residue build-up on other surfaces can contaminate subsequent gases flowing across the surface or contained in the container.

Accordingly, it would be desirable to have an liquid phosphorous precursor delivery system which minimizes the build-up of residue on stainless steel surfaces.

SUMMARY OF THE INVENTION

The present invention recognizes that the build-up of residue in a metal alloy injection valve used to inject a liquid phosphorous precursor compound is due to the nickel in the alloy affecting the liquid phosphorous precursor compound. The invention thus provides components manufactured of an alloy having a low nickel content, preferably less than 5% nickels and more preferably less than 1%. In an additional aspect of the invention, the alloy is provided with a higher chromium content, preferably at least 15% chromium, more preferably 16–27%.

The chromium appears to inhibit the leaching of the metal by the liquid phosphorous precursor compound, thus preventing the nickel being leached out of the metal to affect the liquid phosphorous precursor compound. The nickel appears to act as a catalyst for causing decomposition of the phosphorous precursor compound when heated. Preferably, the components exposed to the phosphorous precursor compound and heat are made of stainless steel alloys of standard industrial designations 430, 440, or 446, which all have a nickel content of less than 1%.

In one embodiment, an injection valve is made of stainless steel alloys of standard industrial designations 430, 440, or 446. This alloy is preferably used for the body of the valve, but in particular for at least the portions of the valve around the injection orifice.

In another embodiment, a polyamide is used for a plug in an injection valve instead of prior art fluoropolymers. The polyamide, preferably Vespel (a 3M product) is used, and exhibits better tolerance to the liquid phosphorous precursor compound and heat. The polyamide can also be used for gaskets and seals.

For a fuller understanding of the nature and advantages of the invention, reference should be made to the ensuing detailed description taken in conjunction with the accompanying drawings.

DESCRIPTION OF THE PREFERRED EMBODIMENT

The following description illustrates one embodiment of the present invention using an injection valve system. The invention also applies to boiler and bubbler systems, with the low nickel stainless steel alloy being used for liquid containers in such systems, or for tubing or conduit, or for any other portion that is exposed to a liquid phosphorous precursor containing compound and also to heat.

Figure 1:
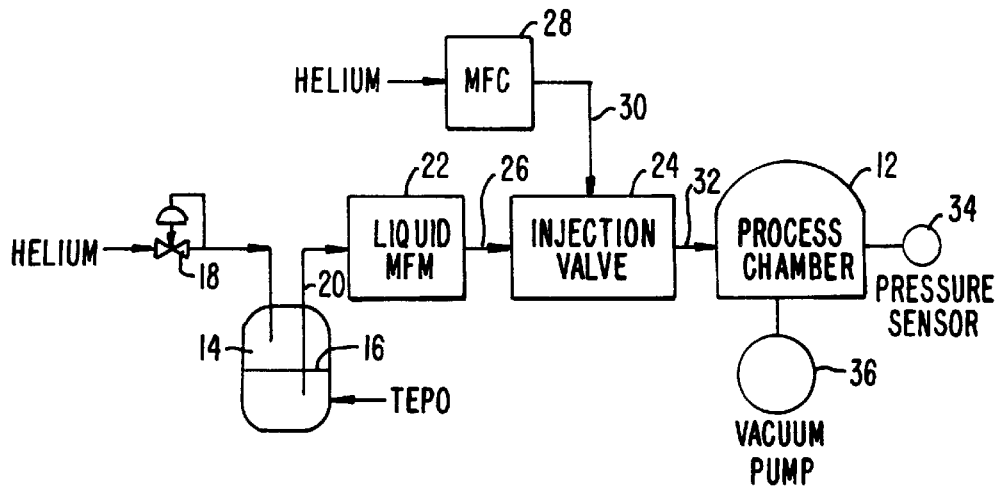
FIG. 1 is a block diagram of a liquid injection system including an injection valve according to the present invention.

FIG. 1 illustrates a basic injection valve system for providing process gases to a process chamber 12. A liquid container 14 containing liquid TEPO 16 is pressurized using helium provided through a valve 18. The pressurized helium in the top of container 14 forces the liquid TEPO 16 through a line 20 to a liquid mass flow meter (LFM) 22 which meters the amount of liquid provided to an injection valve 24 via an injection line 26. The injection valve is also provided with a carrier gas, preferably helium, through a mass flow controller (MFC) 28 and a carrier gas injection line 30. Injection valve 24 converts the liquid from injection line 26 into gaseous form, and provides it along with the carrier gas through an outlet line 32 to process chamber 12. Process chamber 12 includes a monitoring pressure sensor 34 and a vacuum pump 36 for removing exhaust gases.

Figure 2:
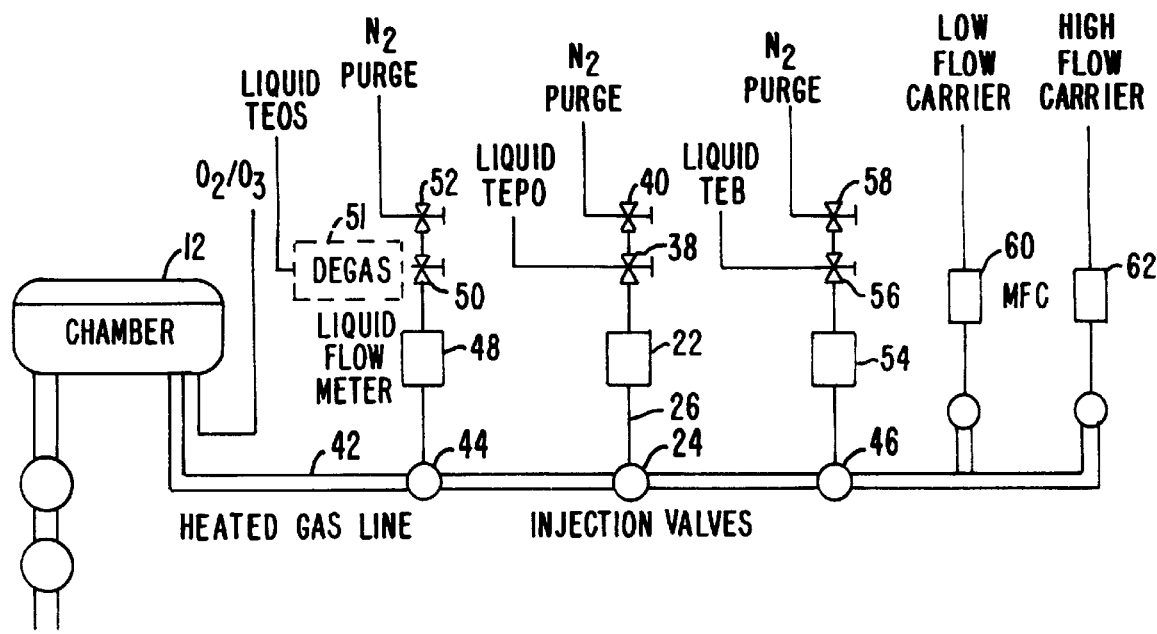
FIG. 2 is a block diagram showing an injection system having multiple injection valves, including an injection valve for TEPO according to the present invention.

FIG. 2 illustrates the application of multiple gases to chamber 12, including the liquid TEPO provided through injection valve 24. In FIG. 2, there is also shown a control valve 38 for liquid TEPO connected to a control valve 44 allowing purging of the gas lines with nitrogen ($N_2$).

FIG. 2 shows injection valve 24 being connected to a common gas line 42 connected to process chamber 12. Also included in gas line 42 are an injection valve 44 for liquid TEOS and an injection valve 46 for liquid TEB. Injection valve 44 has associated with it a liquid flow meter 48 and valves 50 and 52 for controlling the liquid TEOS and nitrogen purge. A degasser 51 may optionally be included to remove helium, where helium is used to pressurize the TEOS (degassers may be used in other gas lines as well). Similarly, injection valve 46 is connected to a liquid flow meter 54 and associated valves 56 and 58 for controlling the liquid TEB and nitrogen. Finally, mass flow controllers 60 and 62 connect to gas line 42 providing a low flow carrier, and high flow carrier, respectively. Preferably, helium is typically used as the carrier.

Figure 3:
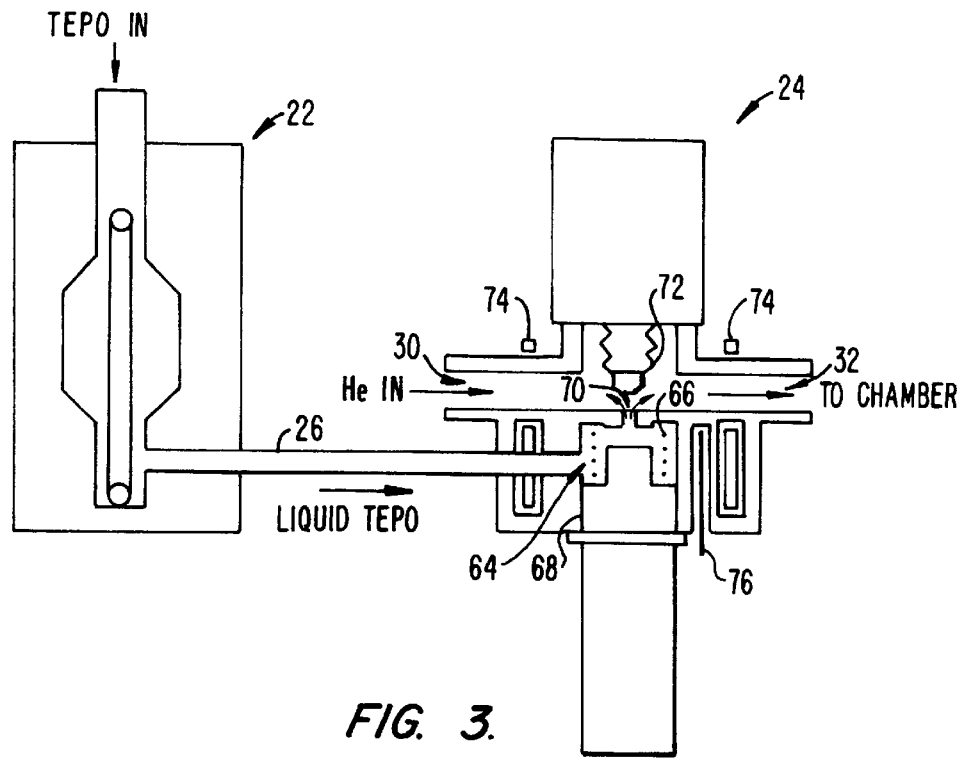
FIG. 3 is a detailed diagram of the injection valve according to the present invention.

FIG. 3 shows injection valve 24 in more detail. The TEPO liquid is provided through liquid mass flow meter 22 via inlet line 26. The inlet line is connected to a chamber 64 which includes a spring 66 for biasing against a plug 68. Plug 68 is moved in and out under processor control in order to control the amount of flow of liquid TEPO. The top of chamber 64 is a gas orifice 70.

Helium is provided as a carrier gas through an inlet line 30, and the combination gas mixture is provided through an outlet line 32 to the process chamber. The gas flow of the helium over the orifice causes a pressure drop which causes the liquid TEPO to vaporize, and be carried with the helium through outlet line 32 to the process chamber. Necessarily, orifice 70 is small in order to aid this vaporization process, and thus is vulnerable to residue build-up. Prior art valves typically include a valve body, including the portion surrounding the orifice, made of a stainless steel alloy. For example, stainless steel alloy SST 316 is used in prior art valves manufactured by Lintec of Japan.

Plug 68 in existing valves is a compressible sealer typically made of Kel-F (a 3M fluoropolymer). We have found that Kel-F tends to swell up and break. Accordingly, another aspect of the present invention is the use of Vespel (DuPont polyamide resin) for the plug. Vespel can also be used for gaskets and seals in any system which utilizes a liquid phosphorous precursor compound.

The valve also includes a shut-off plug 72 which can be lowered to close the orifice when flow is desired to be shut off. Plug 72 is also preferably made of Vespel. Also included are heater elements 74 which function to heat the valve to prevent condensation of the gaseous mixture. A thermal couple 76 allows monitoring of the temperature of the valve.

Figure 4:
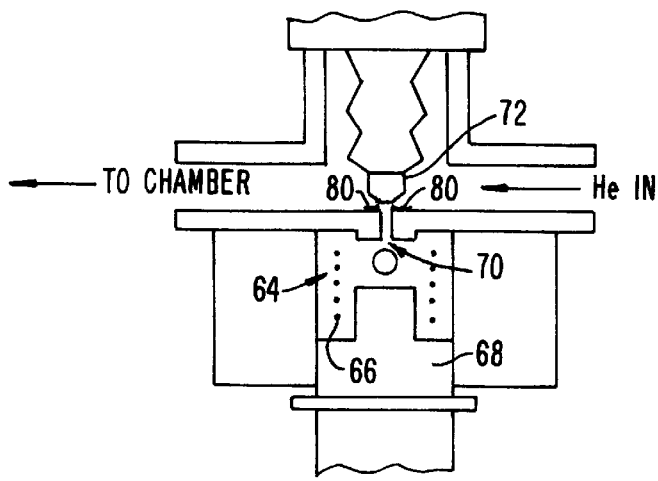
FIGS. 4 and 5 are diagrams illustrating the build-up of residue on an injection valve.

FIG. 4 illustrates a residue build-up 80 around orifice 70 to a level of 300μ. This build-up does not substantially affect the flow of gas out of the orifice, but does impact the proper seating of shut-off plug 72 when it is desirable to stop the flow of TEPO.

Figure 5:
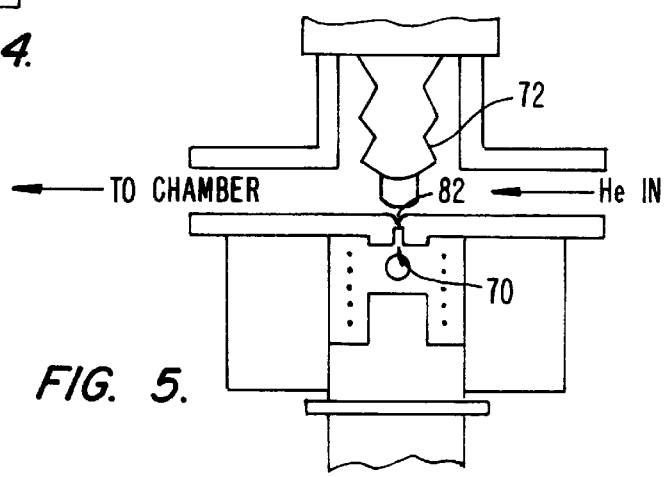

FIG. 5 illustrates a build-up of residue to a thickness of 1800μ, which clogs the orifice itself, as shown by residue 82 in FIG. 5. As can be seen, orifice 70 is completely clogged at this point. Typically, the orifice itself has a diameter of 2 mm.

The inventors of the present invention determined through a series of tests that the presence of nickel in the stainless steel alloy of the valve around orifice 70 was affecting the liquid TEPO, causing the residue build-up. The prior art valves using the stainless steel alloy of SST 316 would typically contain approximately 12–15% nickel, and 16–18% chromium. In an experiment, a valve made of a stainless steel alloy 430, which contains approximately 0.15% nickel and 16–18% chromium was used. The use of such a valve allowed TEPO to flow for 189 hours (equivalent to a throughput of 11,300 wafers). The prior art valve using the 316 alloy, on the other hand, has been typically observed to have a throughput of 1800 wafers prior to clogging due to residue build-up. On the other hand, the 430 test still had no significant residue build-up after 189 hours, suggesting that a much longer lifetime was still available to the valve. The build-up of the residue which has been observed may be due to the nickel helping to decompose TEPO into phosphoric acid and ethanol. This can be avoided by limiting the amount of nickel in the alloy. In addition, the presence of chromium inhibits the leaching of the nickel out of the metal by the TEPO liquid. Alloys with a higher chromium content are preferred, but may be more expensive. Alloy 446, for instance, has approximately 0.6% nickel and 23–27% chromium. Alloy 440 has 0.6% nickel and 16–18% chromium.

In addition, by empirical observation, it was determined that a temperature of approximately 160–170° C., preferably 165° C., for the valve provided an optimum flow of the TEPO liquid, avoiding residue build-up.

The TEPO liquid, used for generating phosphorous precursor gas, is typically used for the BPSG (Boronphosphosilicate glass) and PSG (phosphosilicate glass) process steps in the processing of a wafer.

As will be understood by those with skill in the art, the present invention may be embodied in other specific forms without departing from the spirit or essential characteristics thereof. For example, stainless steel alloys having a higher chromium content or lower nickel content could be used. Additionally, the valve could have an appropriate alloy of stainless steel only around the sensitive orifice area of the valve. The low nickel stainless steel alloy could also be used for stainless steel gaskets. Alternately, a different type of processing system, such as a distillation system with a stainless steel column that comes in contact with a liquid phosphorous precursor compound and heat, could use the present invention. Accordingly, reference should be made to the appended claims for describing the scope of the present invention.

What is claimed is:

1. An apparatus comprising:
   a sealer in contact with a liquid phosphorous precursor compound;
   said sealer being a polyamide.

2. The apparatus of claim 1 wherein said phosphorous precursor compound comprises TEPO, TMP or TEP.

3. The apparatus of claim 1 wherein said sealer is a shut-off or control plug in a valve.

4. The apparatus of claim 1 wherein said sealer is a gasket.

5. An apparatus for delivering a liquid phosphorous precursor compound, comprising:
   a container for holding said liquid phosphorous precursor compound;
   a conduit for delivering said liquid phosphorous precursor compound or a gaseous product of said liquid phosphorous precursor compound;
   wherein at least a portion of said container or said conduit includes a sealer composed of a polyamide.

6. The apparatus of claim 5 wherein said sealer is a shut-off or control plug in a valve.

7. The apparatus of claim 5 wherein said polyamide is Vespel.

8. The apparatus of claim 5 wherein said apparatus is a bubbler system for delivering gases to a chemical reaction chamber for semiconductor wafers.

9. The apparatus of claim 5 wherein said apparatus is a boiler system for delivering gases to a chemical reaction chamber for semiconductor wafers.

10. The apparatus of claim 5 wherein said apparatus is an injection system for delivering gases to a chemical reaction chamber for semiconductor wafers, and wherein said sealer is a plug in an injection valve.

11. The apparatus of claim 5 wherein said sealer is a gasket.

12. The apparatus of claim 5 wherein said phosphorous precursor compound comprises TEPO, TMP or TEP.

13. The apparatus of claim 5 wherein a portion of said container or said conduit is composed of a stainless steel alloy having less than 5% nickel.

14. An liquid flow injection valve for supplying a liquid phosphorous precursor source to a chemical vapor deposition (CVD) chamber comprising:

a container of said liquid phosphorous precursor, said liquid phosphorous precursor being one of TEPO, TMP or TEP:

an injection orifice for connecting to said container; and a valve outlet for delivering a gaseous mixture generated from said liquid phosphorous precursor compound to said CVD chamber;

a shut-off or control plug in said valve, said plug being composed of Vespel.

15. A liquid injection system for a CVD chamber comprising:

a container for holding liquid phosphorous precursor compound, said liquid phosphorous precursor compound being one of TEPO, TMP or TEP;

an injection valve for converting said liquid phosphorous precursor into gaseous form, said injection valve having portions in contact with said liquid phosphorous precursor compound composed of a stainless steel alloy having less than 5% nickel and at least 15% chromium;

a shut-off or control plug in said injection valve, said plug being composed of a polyamide;

a liquid phosphorous precursor compound injection line coupling said container to said injection valve;

a carrier gas source line coupled to said injection valve; and an outlet line coupling said injection valve to said CVD chamber.

* * * * *